US012620898B2

(12) United States Patent (10) Patent No.: US 12,620,898 B2
Li (45) Date of Patent: May 5, 2026

(54) POWER CONVERTER AND CONTROL CIRCUIT THEREOF

(71) Applicant: Joulwatt Technology (Shanghai) Co., Ltd., Shanghai (CN)

(72) Inventor: Linjue Li, Hangzhou (CN)

(73) Assignee: Joulwatt Technology (Shanghai) Co., Ltd., Shanghai (CN)

( * ) Notice: Subject to any disclaimer, the term of this patent is extended or adjusted under 35 U.S.C. 154(b) by 189 days.

(21) Appl. No.: 18/590,774

(22) Filed: Feb. 28, 2024

(65) Prior Publication Data

US 2024/0339929 A1 Oct. 10, 2024

(30) Foreign Application Priority Data

Apr. 10, 2023 (CN) .......................... 202310376440.6

(51) Int. Cl.
*H02M 3/158* (2006.01)
*H02M 1/00* (2006.01)
*H02M 1/44* (2007.01)
*H02M 3/156* (2006.01)
*H03K 4/06* (2006.01)

(52) U.S. Cl.
CPC ......... *H02M 3/158* (2013.01); *H02M 1/0025* (2021.05); *H02M 1/44* (2013.01); *H02M 3/156* (2013.01); *H03K 4/06* (2013.01)

(58) Field of Classification Search
CPC ...... H02M 3/158; H02M 1/0025; H02M 1/44; H02M 3/156; H03K 4/06
See application file for complete search history.

(56) References Cited

U.S. PATENT DOCUMENTS

| | | | | |
|---|---|---|---|---|
| 2024/0178754 | A1* | 5/2024 | Matsumura | ........... H02M 3/158 |
| 2024/0297585 | A1* | 9/2024 | Ge | ....................... H02M 1/0025 |
| 2025/0007403 | A1* | 1/2025 | Brambilla | ............. H02M 3/158 |

FOREIGN PATENT DOCUMENTS

| | | |
|---|---|---|
| CN | 101483386 B | 4/2012 |
| CN | 102611316 B | 7/2014 |
| CN | 108631578 B | 5/2022 |
| CN | 114696579 A | 7/2022 |
| CN | 115706506 A | 2/2023 |
| TW | 201826679 A | 7/2018 |

OTHER PUBLICATIONS

TW 113112810 first office actin dated Nov. 4, 2024.

* cited by examiner

*Primary Examiner* — Gary L Laxton
(74) *Attorney, Agent, or Firm* — IPro, PLLC

(57) ABSTRACT

A control circuit for a power converter includes an error amplifier, a compensation circuit, a comparator, and a controller. The error amplifier generates an error amplification signal according to a first reference signal and a feedback signal. The compensation circuit compensates the error amplification signal to obtain a compensation signal that is a ripple signal, The controller generates a switching control signal according to a predetermined clock pulse signal and a comparison signal of the compensation signal and the feedback signal. The clock pulse signal being used to determine a frequency of the switching control signal, and the comparison signal being used to determine a duty cycle of the switching control signal.

15 Claims, 8 Drawing Sheets

POWER CONVERTER AND CONTROL CIRCUIT THEREOF

CROSS-REFERENCE TO RELATED APPLICATIONS

The present disclosure claims priority to a Chinese patent application No. 202310376440.6, filed on Apr. 10, 2023, and entitled "POWER CONVERTER AND CONTROL CIRCUIT THEREOF", the entire contents of which are incorporated herein by reference, including the specification, claims, drawings and abstract.

TECHNICAL FIELD

The present application relates to the technical field of power supply, and more particularly, to a power converter and its control circuit.

BACKGROUND

With the demand for power electronics and the development of semiconductor technology, power supply management chips are widely used in communication, consumption, computing and other fields. Taking a DC-DC converter as an example, a DC-DC converter is one of the most common among power management chips and typically includes one or more switches that are selectively turned on or off to provide a controlled output voltage according to a received input voltage. The output power of the circuit is regulated by controlling a duty cycle of the signal provided to the one or more switching transistors of the converter.

The control circuit in a DC-DC converter has many control modes. Typically, there are: voltage control mode, current control mode, and constant on-time control mode (COT).

Here, referring to FIG. 1a, there is shown a schematic diagram of a DC-DC converter in a conventional current control mode, such as a peak current control mode. The converter includes: a control circuit 210, a driving circuit 220, and a power stage circuit 230. The control circuit 210 comprises: an error amplifier 211, a current sensing circuit 212, a signal generator 213, an adder 214, a PWM comparator 215, and an RS flip-flop 216. The error amplifier 211 receives a feedback signal FB of an output voltage Vout and a reference signal Vref, and outputs a compensation signal COMP by using a compensation capacitor Ccom. The current sensing circuit 212 detects a current flowing through a switching transistor in the power stage circuit 230 and obtains a sensing voltage signal Vsense accordingly. The signal generator 213 generates both a sawtooth wave signal ramp and a clock pulse signal CLK with the same frequency. The adder 214 superimposes the sensed voltage signal Vsense with the sawtooth wave signal ramp onto obtain a sum signal SUM. The PWM comparator 215 compares the feedback signal FB and the sum signal SUM and provides a pulse signal to a reset terminal of the RS flip-flop 216. A set terminal of the RS flip-flop 216 receives a clock pulse signal CLK. The RS flip-flop 216 generates a PWM signal for the driving circuit 220 according to signal changes at the set terminal and the reset terminal. The driving circuit 220 outputs complementary driving signals HS and LS to the power stage circuit 230 according to the received PWM signal.

Referring to FIG. 1b, a schematic diagram of a DC-DC converter in a constant on-time control mode is shown. The converter includes: a control circuit 310, a driving circuit 320, and a power stage circuit 330. The control circuit 210 comprises: a loop comparator 311, a timer 312, and an RS flip-flop 313. The loop comparator 311 receives a feedback signal FB of an output voltage Vout and a reference signal Vref. When the feedback signal FB is less than the reference signal Vref, the loop comparator 311 outputs a pulse signal to the set terminal of the RS flip-flop 313. The pulse signal from the loop comparator 311 further controls the timer 312 to start timing, and after a predetermined time period Ton, a triggering signal is output to the reset terminal of the RS flip-flop 313. The RS flip-flop 313 generates a PWM signal for the driving circuit 320 according to signal changes at its set terminal and reset terminal. The driving circuit 320 outputs complementary drive signals HS and LS to the power stage circuit 330 according to the received PWM signal.

However, the conventional DC-DC converter has the following problems:

1. On one hand, the DC-DC converter in a conventional peak current control mode needs to sample a current through the switching transistor to achieve control, and on the other hand, it needs a high-bandwidth error amplifier to achieve fast dynamic response. The circuit is more complex, and a current sampling circuit is not easy to use for a high-frequency circuit control.

2. Although the conventional DC-DC converter in a constant conduction time control mode has a fast dynamic response speed, a frequency error is large, and the frequency error will increase with the increase of the switching frequency, which is not easy to synchronize with an external clock.

Therefore, it is necessary to provide improved technical solutions to overcome the above technical problems in the existing technology.

SUMMARY

In order to solve the above technical problems, the present disclosure provides a power converter and its control circuit, which can solve the problem of achieving a fast dynamic response and flexibility of choosing components according to a switching frequency of the power converter.

According to a first aspect of the present disclosure, there is provided a control circuit of a power converter for generating a switching control signal to control a switching transistor in the power converter, the control circuit comprising:

an error amplifier that receives a first reference signal and a feedback signal and outputs an error amplification signal, the feedback signal being obtained according to an output signal of the power converter;

a compensation circuit that compensates the error amplification signal to obtain a compensation signal, the compensation signal being a ripple signal;

a comparator that compares the feedback signal and the compensation signal to obtain a comparison signal;

a controller that generates the switching control signal according to a predetermined clock pulse signal having a first frequency and the comparison signal, the clock pulse signal being used to determine a frequency of the switching control signal, and the comparison signal being used to determine a duty cycle of the switching control signal.

Optionally, the controller is configured to:

switch the switching control signal from an invalid state to a valid state according to a rising edge of the clock pulse signal; and switch the switching control signal from a valid state to an invalid state according to a rising edge of the comparison signal, wherein a rising edge of the comparison signal occurs when the compensation signal drops to less than the feedback signal.

Optionally, the controller is configured to:

switch the switching control signal from an invalid state to a valid state according to a rising edge of the comparison signal; and switch the switching control signal from a valid state to an invalid state according to a rising edge of the clock pulse signal, wherein a rising edge of the comparison signal occurs when the compensation signal rises to be greater than the feedback signal.

Optionally, a falling slope of the compensation signal is positively correlated with an input voltage of the power converter.

Optionally, a falling slope of the compensation signal is positively correlated with the difference between an input voltage and an output voltage of the power converter, and a rising slope of the compensation signal is positively correlated with a sum of an input voltage and an output voltage of the power converter.

Optionally, the compensation circuit is configured to:

generate a triangular wave signal according to the second reference signal and the switching control signal, the triangular wave signal representing inductor current information of the power converter, superimpose the triangular wave signal onto the error amplification signal in the compensation circuit to achieve compensation for the error amplification signal.

Optionally, the compensation circuitry comprises:

a triangular wave signal generating branch coupled between an output of the error amplifier and a reference ground, the triangular wave signal generating branch is configured to discharge a compensation capacitor according to a first discharge current and the second reference signal during a valid period of the switching control signal, and to charge the compensation capacitor with a second reference signal during an invalid period of the switching control signal, thereby generating the triangular wave signal.

Optionally, the first discharge current is controlled by an input voltage of the power converter.

Optionally, the triangular wave signal generating branch comprises:

a first capacitor, a first switch and a current source sequentially coupled in series between an output of the error amplifier and a reference ground, the first current source being used to provide the first discharge current;

a first resistor coupled between an intermediate node of the first capacitor and the first switch and a receiving terminal of the second reference signal, wherein the first switch is in an on state during a valid period of the switching control signal and is in an off state during an invalid period of the switching control signal.

Optionally, the compensation circuit further generates a sawtooth wave signal according to the second reference signal and the switching control signal;

the compensation circuit further superimposes the sawtooth wave signal onto the error amplification signal to achieve compensation for the error amplification signal.

Optionally, the compensation circuitry further comprises:

a first sawtooth wave signal generating branch coupled between an output of the error amplifier and a reference ground.

wherein the first sawtooth wave signal generation branch is configured to discharge a compensation capacitor according to a second discharge current during a valid period of the switching control signal, and to couple the compensation capacitor to the second reference signal during an invalid period of the switching control signal, thereby generating the sawtooth wave signal.

Optionally, the second discharge current is controlled by an output voltage of the power converter.

Optionally, the first sawtooth wave signal generation branch comprises:

a second capacitor and a second current source sequentially coupled in series between an output of the error amplifier and a reference ground, the second current source being used to provide the second discharge current.

a second switch coupled between an intermediate node of the second capacitor and the second current source and a receiving terminal of the second reference signal, wherein the second switch is in an off state during a valid period of the switching control signal and is in an on state during an invalid period of the switching control signal.

Optionally, the compensation circuitry further comprises:

a second sawtooth wave signal generating branch coupled between an output of the error amplifier and a reference ground, wherein the second sawtooth wave signal generation branch is configured to generate the sawtooth wave signal by coupling the compensation capacitor to a reference ground during a valid period of the switching control signal, and to charge the compensation capacitor with a first charging current during an invalid period of the switching control signal;

the first charging current is controlled by an input voltage of the power converter.

Optionally, the second sawtooth wave signal generation branch comprises:

a third current source coupled to an output of the error amplifier through a second capacitor, the third current source being used for providing the first charging current;

a third switch coupled between an intermediate node of the second capacitor and the third current source, and a reference ground.

wherein the third switch is in an on state during a valid period of the switching control signal and is in an off state during an invalid period of the switching control signal.

According to a second aspect of the present disclosure, there is provided a power converter comprising:

at least one power stage circuit, each of the power stage circuits comprising an inductor and a switching transistor coupled to the inductor;

the control circuit as mentioned above for providing a switching control signal to the at least one power stage circuit to control a switching transistor in each power stage circuit.

According to a third aspect of the present disclosure, there is provided a control method of a power converter, comprising:

obtaining an error amplification signal according to a first reference signal and a feedback signal, the feedback signal being obtained according to an output voltage of the power converter;

compensating the error amplification signal to obtain a compensation signal, the compensation signal being a ripple signal;

comparing the feedback signal and the compensation signal to obtain a comparison signal;

generating a switching control signal according a predetermined clock pulse signal having a first frequency and the comparison signal, the switching control signal being used to control a switching transistor in the power converter, wherein the clock pulse signal is used to determine a frequency of the switching control signal and the comparison signal is used to determine a duty cycle of the switching control signal.

Optionally, the step of compensating for the error amplification signal comprises:

superimposing both the triangular wave signal and the sawtooth wave signal onto the error amplification signal to achieve compensation for the error amplification signal.

Optionally, the step of generating the switching control signal according to the predetermined clock pulse signal having a first frequency and the comparison signal comprises:

switching the switching control signal from an invalid state to a valid state at a rising edge of the clock pulse signal;

switching the switching control signal from a valid state to an invalid state at a rising edge of the comparison signal, wherein a rising edge of the comparison signal occurs when the compensation signal drops to less than the feedback signal.

Optionally, the step of generating the switching control signal according to the predetermined clock pulse signal having a first frequency and the comparison signal comprises:

switching the switching control signal from an invalid state to a valid state at a rising edge of the comparison signal;

switching the switching control signal from a valid state to an invalid state at a rising edge of the clock pulse signal, wherein a rising edge of the comparison signal occurs when the compensation signal rises to be greater than the feedback signal.

Optionally, a falling slope of the compensation signal is positively correlated with an input voltage of the power converter.

Optionally, a falling slope of the compensation signal is positively correlated with the difference between an input voltage and an output voltage of the power converter, and a rising slope of the compensation signal is positively correlated with a sum of an input voltage and an output voltage of the power converter.

The present disclosure achieves at least the following beneficial effects:

The control circuit according to an embodiment of the present disclosure generates a switching control signal with a frequency which is defined by a clock pulse signal with a first frequency. A constant frequency control of the power converter can be achieved, thereby enabling the power converter to have a higher accuracy of the switching frequency, which is beneficial for achieving optimization of electromagnetic interference and noise. A compensation signal is generated as a ripple signal after an error amplification signal is compensated. A duty cycle of the switching control signal is defined by comparing the compensation signal and the feedback signal, thereby enabling a fast response of the power converter without current detection and a high-bandwidth error amplifier, which not only facilitates a high-frequency application of the power converter, but also results in reduced circuit complexity.

It should be noted that the above general description and the following detailed description are exemplary and explanatory only and do not limit the present disclosure.

DETAILED DESCRIPTION

In order to facilitate the understanding of the present disclosure, a more comprehensive description of the present disclosure will be given below with reference to the relevant accompanying drawings. Preferred embodiments of the present disclosure are given in the accompanying drawings. However, the present disclosure may be implemented in different forms and is not limited to the embodiments described herein. Rather, the purpose of providing these embodiments is to provide a more thorough and comprehensive understanding of the content of the present disclosure.

The power converter according to an embodiment of the present disclosure, in a various exemplary example illustrated and described below, is only an exemplary illustration of a power converter system of a step-down type, such as a DC-DC converter. The control circuit according to an embodiment of the present disclosure is used for performing a PWM control of the DC-DC converter. However, the present disclosure is not limited thereto. Various concepts disclosed herein can be used in any type of DC-DC converter architecture, according to the topology classification of a power circuit, such as a Buck-type converter, a Boost-type converter, a Flyback-type converter, and a Buck-Boost-type converter, etc. Moreover, although complementary PWM control of a high-side switching device and a low-side switching device is illustrated in an embodiment of the present disclosure, the concepts described in the present disclosure can be implemented in a power converter that uses only a single switching device and/or in a power converter that applies more than two pulse width modulation.

Embodiment 1

A power converter according to an embodiment of the present disclosure includes: at least one power stage circuit and a control circuit coupled to the at least one power stage circuit. Each power stage circuit includes an inductor and a switching transistor coupled to the inductor; a control circuit is used to provide a switching control signal to at least one power stage circuit to control a switching transistor in each power stage circuit. Here, FIG. 2 only shows an example of a single-phase power converter in which a control circuit 400 is coupled to one power stage circuit. However, in other examples, the control circuit can also be applied to multi-phase control of a multi-phase power converter, which is not limited by the present disclosure.

Figure 1A:
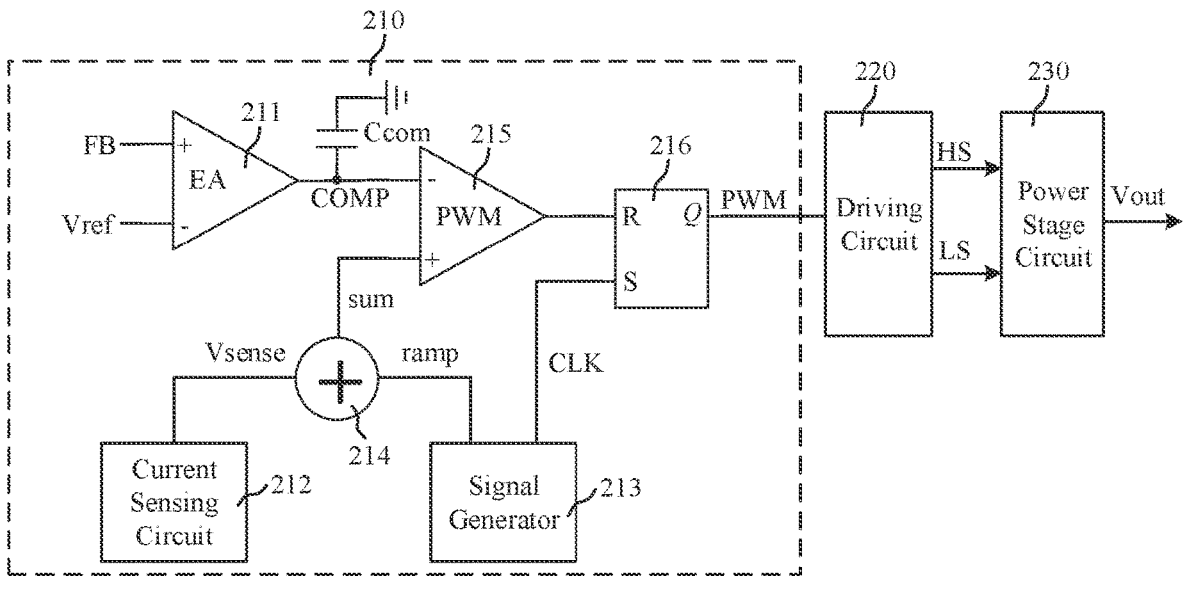
FIG. 1a shows a schematic diagram of a DC-DC converter with a constant on-time control mode.
Figure 1B:
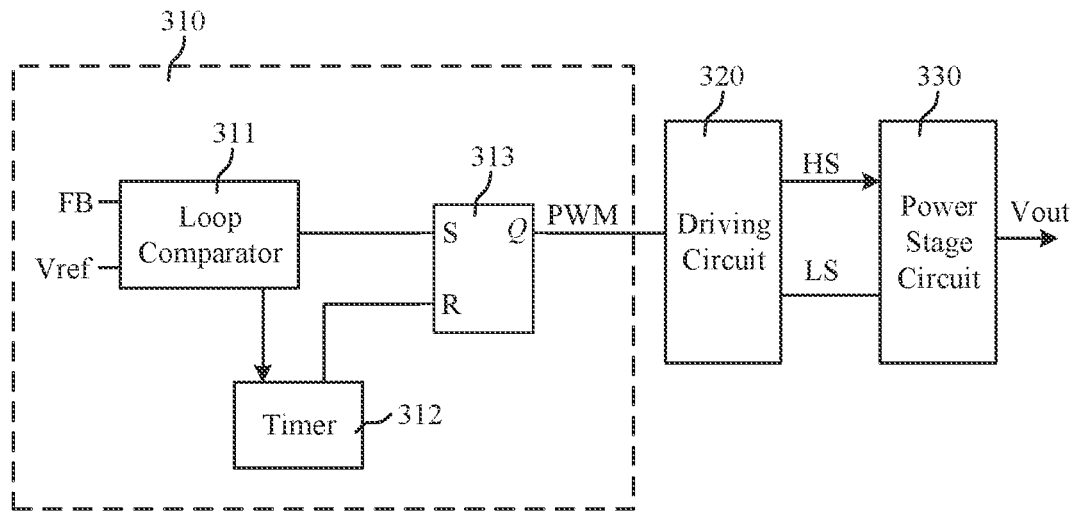
FIG. 1b shows a schematic diagram of a DC-DC converter with a constant on-time control mode.
Figure 2:
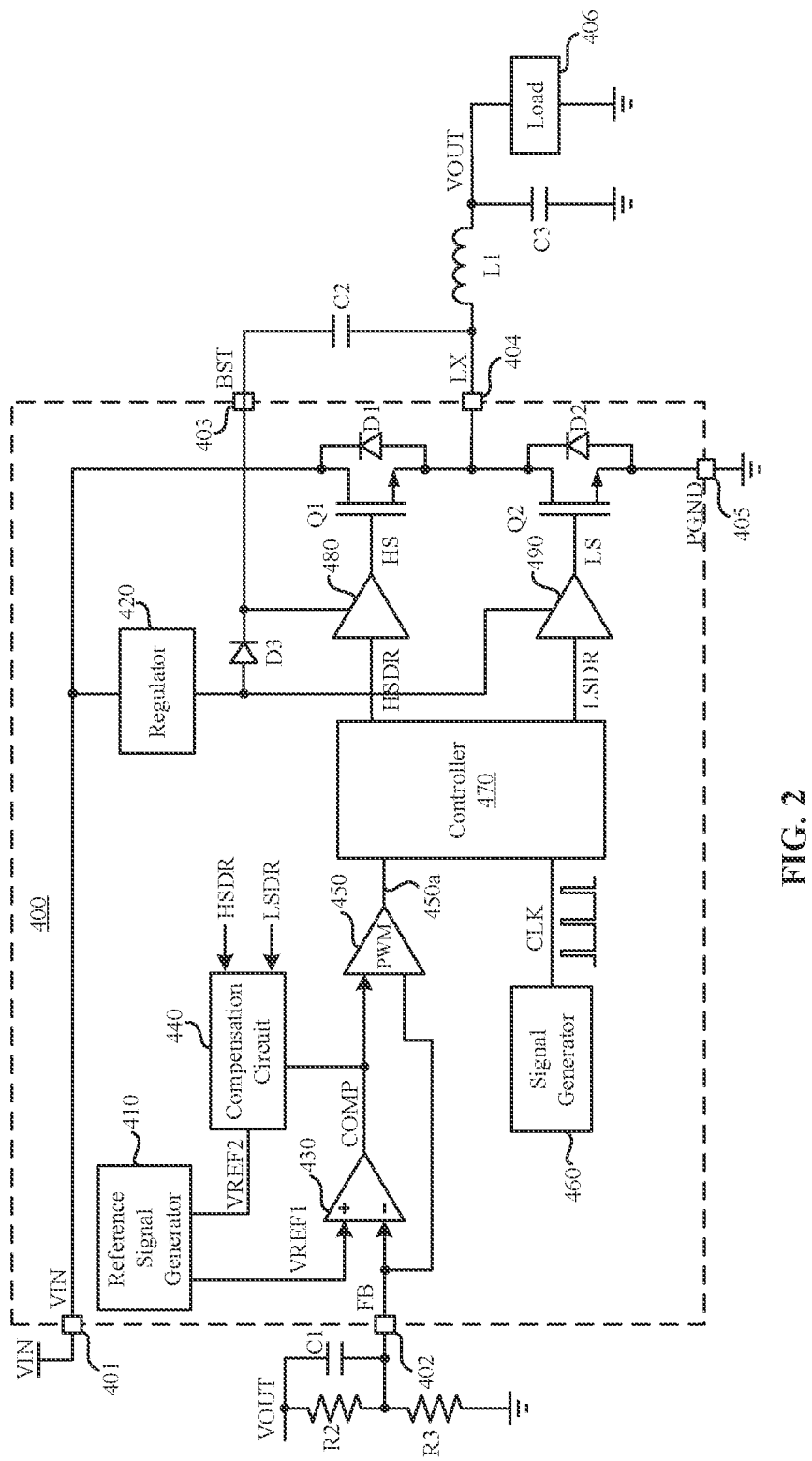
FIG. 2 shows a schematic diagram of a power converter according to an embodiment of the present disclosure.

Referring to FIG. 2, there is shown a schematic view of a power converter according to an embodiment of the present disclosure, which may be implemented as an integrated circuit with various terminals or pins. As shown, the control circuit 400 is coupled to other components of a DC-DC converter. Moreover, in the example of FIG. 2, the integrated circuit 400 includes power conversion devices Q1 and Q2, and corresponding high-side driver 480 and low-side driver 490. However, in other possible examples, one or all of these components may be outside the integrated circuit 400. Similarly, the control circuit 400 in FIG. 2 also has a terminal 405 which is coupled to an external reference ground of the buck converter; a terminal 404 which is coupled to an external inductor L1 of the buck converter, an output capacitor C3, and a load 406; a terminal 403 which is coupled to an external bootstrap capacitor C2 of the buck converter; a terminal 402 which is coupled to an external feedback circuit of the buck converter (including resistors R2, R3 and a capacitor C1); and a terminal 401 which receives an input voltage Vin. However, some other examples are possible. One or more of these components may be integrated into the integrated circuit 400. Or, when the output voltage Vout is low, the control circuit 400 may also be coupled directly to an output of the power converter through the terminal 402, without the feedback circuit R2, R3, and C1.

The system shown in FIG. 2 is implemented as a buck converter which operates in a fixed frequency control mode by the integrated circuit 400. In this embodiment, the control circuit 400 adjusts an output voltage VOUT according to a reference signal VREF1. However, other embodiments are also possible, in which the control circuit 400 may adjust the output voltage according to a preset signal being supplied outside. For example, the control circuit 400 is further provided with a reference signal generator 410 and a low voltage drop (LDO) regulator 420. The reference signal generator 410 is activated according to an enable signal to provide a reference signal VREF1 and a reference signal VREF2, thereby regulating an output of the DC-DC converter. The low-dropout (LDO) regulator 420 provides an output to supply power to the switch drivers 480 and 490.

The high-side driver 480 is coupled to an output of the regulator 420 through a diode D3 for supplying power.

Switching transistors Q1 and Q2 are NMOS transistors with corresponding diodes D1 and D2 which are coupled as shown in FIG. 2. However, the present disclosure is not limited thereto. Other embodiments using different types of switching transistors are also possible, and/or switching transistors Q1 and Q2 may be integrated outside the control circuit 400.

Figure 3:
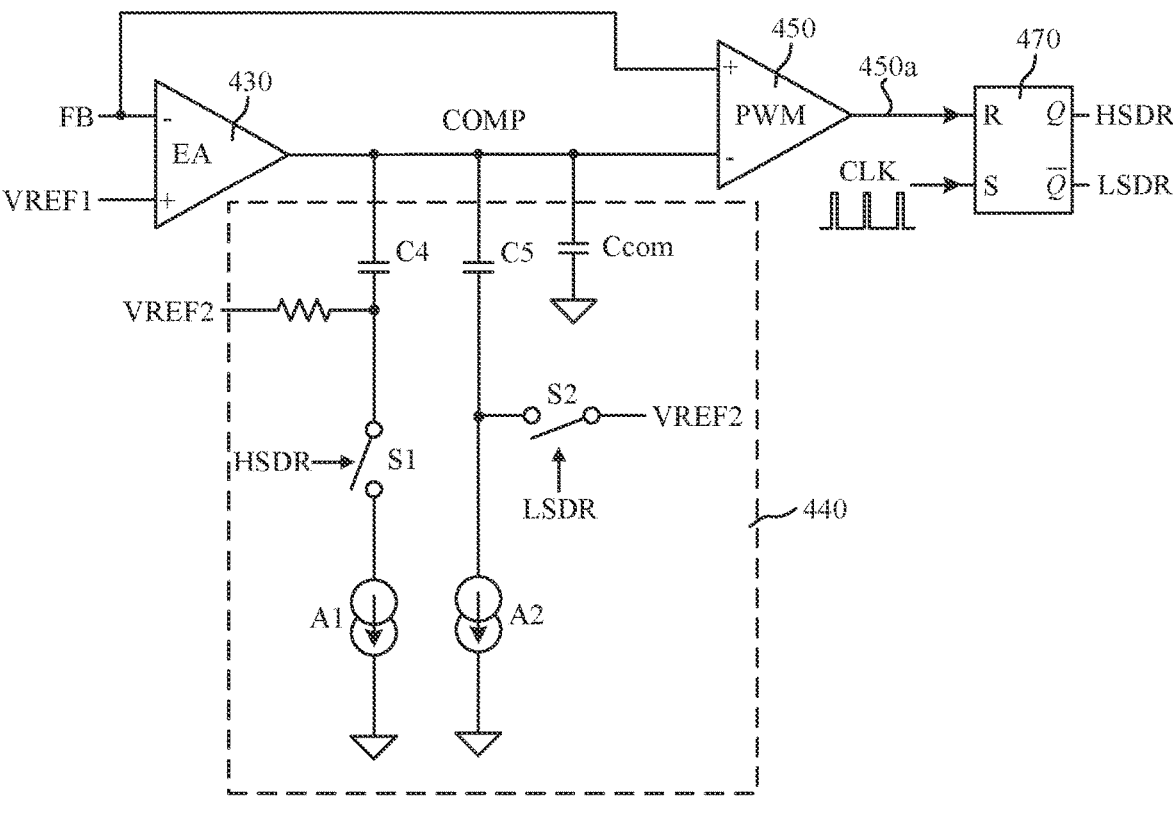
FIG. 3 shows a schematic diagram of a compensation circuit and a circuit module coupled thereto in a control circuit according to a first embodiment of the present disclosure.

As further shown in connection with FIGS. 2 and 3, the control circuit 400 includes a pulse generation circuit having an error amplifier 430, a compensation circuit 440, a PWM comparator 450, a signal generator 460, and a controller 470.

The error amplifier 430 includes a positive input terminal that receives the reference signal VREF1 and a negative input terminal that receives the feedback signal FB, which is obtained according to an output signal (such as an output voltage VOUT) of the DC-DC converter, representing an output parameter of the converter. The error amplifier 430 has an output that provides an error amplification signal representing difference between the feedback signal FB and the reference signal VREF1. During operation, the error amplifier 430 amplifies the difference between the feedback signal FB at the negative input terminal and the reference signal VREF1 at the positive input terminal to generate an error amplification signal.

The error amplification signal is further coupled to the compensation circuit 440, which compensates for the error amplification signal to obtain the compensation signal COMP.

The comparator 450 includes a positive input terminal that receives the feedback signal FB and a negative input terminal that receives the compensation signal COMP, and the comparator 450 outputs a comparison signal 450a to the controller 470 after comparing the feedback signal FB and the compensation signal COMP. The comparison signal 450a represents a magnitude relationship between the compensation signal COMP and the feedback signal FB, and further indicates the moment when the compensation signal COMP drops to the feedback signal FB. During operation, the comparator 450 outputs a rising edge of the comparison signal 450a when the compensation signal COMP drops to less than the feedback signal FB, and outputs a falling edge of the comparison signal 450a when the compensation signal COMP rises to greater than the feedback signal FB.

The signal generator 460 is used to provide a clock pulse signal CLK having a first frequency to the controller 470. During actual operation, the first frequency may be determined or adjusted, for example, according to an input voltage VIN and an output voltage VOUT of the DC-DC converter.

The controller 470 receives the clock pulse signal CLK and the comparison signal 450a, and generates a complementary high-side driver signal HSDR and low-side driver signal LSDR, which are provided as inputs to the high-side driver 480 and the low-side driver 490, respectively. The high-side driver 480 outputs a first switching control signal HS to the high-side switch transistor Q1, and the low-side driver 490 outputs a second switching control signal LS to the low-side switch transistor Q2.

During operation, the controller 470 will switch the high-side driver signal HSDR from an invalid state to a valid state, and switch the low-side driver signal LSDR from the valid state to the invalid state, upon receiving a rising edge of the clock pulse signal CLK; The controller 470 will switch the high-side driver signal HSDR from the valid state to the invalid state, and switch the low-side driver signal LSDR from the invalid state to the valid state, upon receiving a rising edge of the comparison signal 450a. The clock pulse signal CLK controls an on time of the high-side switching transistor Q1 to determine frequencies of the high-side driver signal HSDR and the low-side driver signal LSDR. Thus, the frequencies of the high-side driver signal HSDR and the low-side driver signal LSDR are equal to the frequency of the clock pulse signal CLK. The comparison signal 450a controls an off time of the high-side switching transistor Q1 to determine duty cycles of the high-side driver signal HSDR and the low-side driver signal LSDR. An output voltage Vout at the load 406 is driven by adjusting the pulse width of the high-side driver signal HSDR so that the output voltage Vout corresponds to a reference level represented by the reference signal VREF1. It can be understood that the switching control signal described herein corresponds to the high-side driver signal HSDR, and when the duty cycle and frequency of the high-side driver signal HSDR change, the duty cycle and frequency of the low-side driver signal LSDR also change accordingly. In the example shown in FIG. 3, the controller 470 may be implemented as, for example, an RS flip-flop, for achieving corresponding functions. Here, the controller 470 receives the clock pulse signal CLK at a set terminal S and the comparison signal 450a at a reset terminal R.

Figure 4:
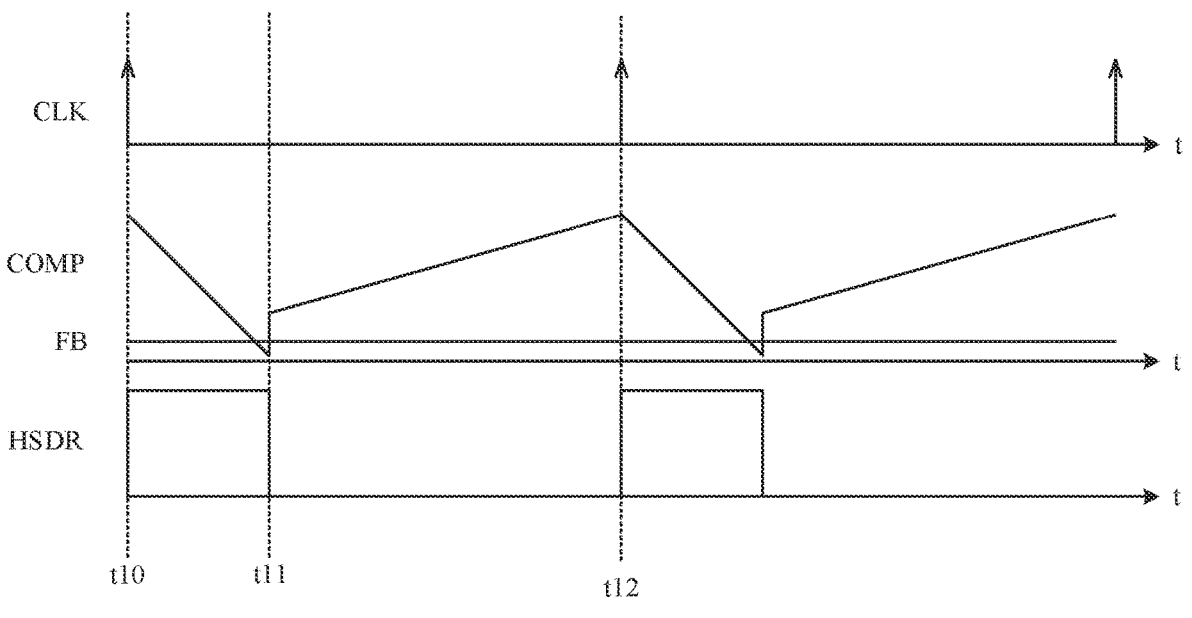
FIG. 4 shows schematic waveforms of the control circuit as shown in FIG. 2 during each switching cycle according to the first embodiment of the present disclosure.

As further shown in FIGS. 3 and 4, the compensation signal COMP obtained after compensation by the compensation circuit 440 is a ripple signal that represents inductor current information of the power converter, so that the comparator 450 can obtain a comparison signal 450a in the form of a pulse signal by comparing the feedback signal FB with the compensation signal COMP. Thus, a switching control signal can be obtained according to the comparison signal 450a. The whole process can achieve a closed-loop feedback control without sampling an inductor current, and the response speed is fast. Not only is it easy to realize the high-frequency application of the power converter, but also is the circuit complexity reduced.

In the embodiment shown in FIG. 3, the compensation circuit 440 is configured to generate a triangular wave signal that represents the inductor current information of the power converter according to the reference signal VREF2 and the switch control signal, and superimpose the triangular wave signal onto the error amplification signal, thereby achieving compensation for the error amplification signal.

As shown in FIG. 3, the compensation circuit 440 includes: a compensation capacitor Ccom coupled in parallel between an output of the error amplifier and a reference ground, as well as the triangular wave signal generating branch. Here, the triangular wave signal generating branch is configured to discharge the compensation capacitor Ccom according to a first discharge current (denoted as I1) and the reference signal VREF2 during a valid period of the switching control signal, and to charge the compensation capacitor Ccom according to the reference signal VREF2 during an invalid period of the switching control signal, thereby generating the triangular wave signal. Here, the first discharge current I1 is controlled by an input voltage VIN of the power converter.

In the embodiment shown in FIG. 3, the triangular wave signal generating branch further comprises: a resistor R1, capacitor C4, a switch S1 and a current source A1. The capacitor C4, the switch S1, and the current source A1 are sequentially coupled in series between the output of the error amplifier 430 and the reference ground, the resistor R1 is coupled between an intermediate node of the capacitor C4 and the switch S1 and a receiving terminal of the reference signal VREF2, and the current source A1 is used to provide the discharge current I1. In some examples, the switch S1 may be implemented, for example, as an NMOS transistor, and a control terminal of the switch S1 receives the high-side driver signal HSDR. Here, the capacitor C4 has the function of isolating DC component, which may be omitted in other embodiments, equivalent to merging with the compensation capacitor Ccom.

It can be understood that when the circuit is in a steady state, the reference signal VREF2 is related to an output voltage VOUT. In such a case, a current flowing through the resistor R1 is equal to I1*D, and D represents a duty cycle of the switching control signal. Furthermore, during a valid period of the switching control signal, that is, when the high-side driver signal HSDR is valid, the current flowing to the compensation capacitor Ccom is:

$$I1*D - I1 = *I1*(D-1), \tag{1}$$

Here, according to capacitor characteristics and equation (1), it can be obtained that:

$$C*\frac{du}{dt} = I1*(D-1), \tag{2}$$

According to inductor characteristics:

$$L*\frac{di}{dt} = VIN - VOUT = VIN*(1-D), \tag{3}$$

Combining equation (2) and equation (3), a ratio (denoted as k1) of rates of change of a capacitor current and an inductor voltage during a valid period of the switching control signal is:

$$k1 = -\frac{L*I1}{VIN*C}, \tag{4}$$

wherein C denotes a capacitance value of the compensation capacitor Ccom and L denotes an inductance value of the inductor L1.

Further, during an invalid period of the switching control signal, that is, when the low-side driver signal LSDR is valid, a current flowing to the compensation capacitor Ccom is:

$$I1*D, \tag{5}$$

In such a case, according to capacitor characteristics and equation (5), it can be obtained:

$$C*\frac{du}{dt} = I1*D, \tag{6}$$

According to inductor characteristics, it can be obtained:

$$L * \frac{di}{dt} = -VOUT = -VIN * D, \tag{7}$$

Combining equation (6) and equation (7), it can be obtained that a ratio (denoted as k2) of rates of change of a capacitor current and an inductor voltage during an valid period of the switching control signal is:

$$k2 = -\frac{L * I1}{VIN * C} \circ \tag{8}$$

From equation (4) and equation (8), it can be seen that in each of the two signal states of the switching control signal in each switching cycle, a voltage ripple generated by the triangular wave signal on compensation capacitor Ccom is inversely proportional to the inductor current. Both of the triangular wave signal and the compensation signal COMP represent the inductor current information of the power converter due to such inverse proportional relationship. It can be understood that in this embodiment, a triangular wave signal that represents the inductor current information is superimposed onto an error amplification signal to obtain a comparison signal. This approach allows for a closed-loop feedback control without the need for sampling an inductor current, thereby improving system response speed and thus realizing high-frequency applications of the power converter, and reducing circuit complexity.

In a further preferred embodiment, the compensation circuit 440 is further configured to generate a sawtooth wave signal according to the reference signal VREF2 and the switching control signal and further superimpose the sawtooth wave signal onto an error amplification signal, thereby achieving compensation for the error amplification signal within a preset time period during which an inductor current increases in the power converter.

As shown in FIG. 3, the compensation circuit 440 further comprises a sawtooth wave signal generating branch coupled in parallel between an output of the error amplifier and a reference ground. Here, the sawtooth wave signal generating branch is configured to discharge the compensation capacitor Ccom according to a second discharge current (denoted as I2) during a valid period of the switching control signal, and to couple the compensation capacitor Ccom to a reference signal VREF2 during an invalid period of the switching control signal, thereby generating the aforementioned sawtooth wave signal. Here, the second discharge current I2 is controlled by an output voltage VOUT of the power converter.

In the embodiment shown in FIG. 3, the generating branch of sawtooth wave signal further comprises: a capacitor C5, a switch S2 and a current source A2. The capacitor C5 and the current source A2 are sequentially coupled in series between an output of the error amplifier 430 and a reference ground, the switch S2 is coupled between an intermediate node of the capacitor C5 and the current source A2 and a receiving terminal of the reference signal VREF2, and the current source A2 is used to provide a second discharge current I2. The switch S1 is in an on state during a valid period of the switching control signal, and is in an off state during an invalid period of the switching control signal. The switch S2 is in an off state during a valid period of the switching control signal, and is in an on state during an invalid period of the switching control signal. In some examples, the switch S2 may be implemented, for example, as an NMOS transistor, and a control terminal of the switch S2 receives the low-side driver signal LSDR. Here, the capacitor C5 has the function of isolating DC component, which may be omitted in other embodiments, which is equivalent to merging with the compensation capacitor Ccom.

Since the control circuit 400 according to the embodiment of the present disclosure operates in a fixed frequency control mode, the system is prone to incur unstable phenomena such as subharmonic oscillation when a duty cycle of the switching control signal is greater than 50%. By superimposing a sawtooth wave signal onto the error amplification signal, it is equivalent to performing additional ramp compensation for the compensation signal COMP, thereby avoiding subharmonic oscillation and other unstable phenomena.

In the embodiment shown in FIG. 3, the triangular wave signal and the sawtooth wave signal are superimposed onto the error amplification signal. A falling slope of the triangular wave signal is positively correlated with the difference VIN-VOUT between the input voltage and the output voltage of the power converter, and a falling slope of the sawtooth wave signal is positively correlated with the output voltage VOUT of the power converter. Thus, a falling slope of the compensation signal COMP is positively correlated with an input voltage VIN of the power converter. Because of the positively correlated falling slope of the compensation signal COMP with the input voltage VIN, an effect of feed-forward control of the system can be achieved. That is, when the input voltage VIN changes, a duty cycle of the high-side driver signal HSDR can be changed accordingly. For example, when the input voltage VIN increases, the falling slope of the compensation signal COMP becomes larger, and the compensation signal COMP drops faster to less than the feedback signal FB, which results in a decrease in the duty cycle of the high-side driver signal HSDR. This enables an suppression effect on the fluctuation of the input voltage VIN.

Assuming that the first discharge current I1=VIN*GM and the second discharge current I2=VOUT*GM, in this embodiment, it can be seen from FIG. 3 that when the high-side switch transistor Q1 is turned on in each switching cycle, that is, during a valid period of the high-side driver signal HSDR, a descending slope m1 of the triangular wave signal generated by the triangular wave signal generating branch is:

$$m1 = \frac{(VIN - VOUT) * G_M}{Ccom}, \tag{9}$$

a descending slope m2 of the sawtooth wave signal generated by the sawtooth wave signal generating branch is:

$$m2 = \frac{VOUT * G_M}{Ccom}, \tag{10}$$

a descending slope m3 of the compensation signal COMP is:

$$m3 = m1 + m2 = \frac{VIN * G_M}{Ccom}, \tag{11}$$

where GM denotes transconductance of the current source A1 and the current source A2. It can be seen from the above equations (9), (10) and (11) that an example of the compensation circuit 440 shown in FIG. 3 can achieve a positively correlated relationship between the descending slope of the triangular wave signal and the difference VIN-VOUT between an input voltage and an output voltage, a positively correlated relationship between the descending slope of the sawtooth wave signal and the output voltage VOUT, and a positively correlated relationship between the descending slope of the compensation signal COMP and the input voltage VIN. However, other examples are possible, and the compensation circuit 440 may be implemented as other different forms of circuitry, with the same positively correlated relationship as described above. For example, the first discharge current I1=VIN*GM and the second discharge current I2=VOUT*GM are described above as a preferred embodiment of the present disclosure. However, the first discharge current I1 and the second discharge current I2 may be selected to have other suitable design values.

Referring to FIG. 4, at the beginning of each switching cycle, for example, at time t10, there is a rising edge of a clock pulse signal, which triggers the controller 470 to switch the high-side driver signal HSDR to a valid state such as a high level and to switch the low-side driver signal LSDR to an invalid state such as a low level. The switch S1 is turned on and the switch S2 is turned off. Thus, a different current between the current source A1 and a current through the resistor R1 by the reference signal VREF2 discharges the compensation capacitor Ccom through a capacitor C4, while the current source A2 charges the compensation capacitor Ccom through a capacitor C5, so that a voltage of the compensation signal COMP drops. When the voltage of the compensation signal COMP drops below the feedback signal FB, at time t11, there is is a rising edge of the comparison signal 450a, which triggers the controller 470 to switch the high-side driver signal HSDR to an invalid state and the low-side driver signal LSDR to a valid state. The switch S1 is turned off and the switch S2 is turned on. Thus, the reference signal VREF2 charges the compensation capacitor Ccom through the resistor R1 and the capacitor C4, while the reference signal VREF2 also charges the compensation capacitor Ccom through the capacitor C5, so that a voltage of the compensation signal COMP rises. At the beginning of a next switching cycle, such as time t12, the clock pulse signal CLK appears a rising edge again, and the aforementioned process is repeated.

Embodiment 2

Figure 5:
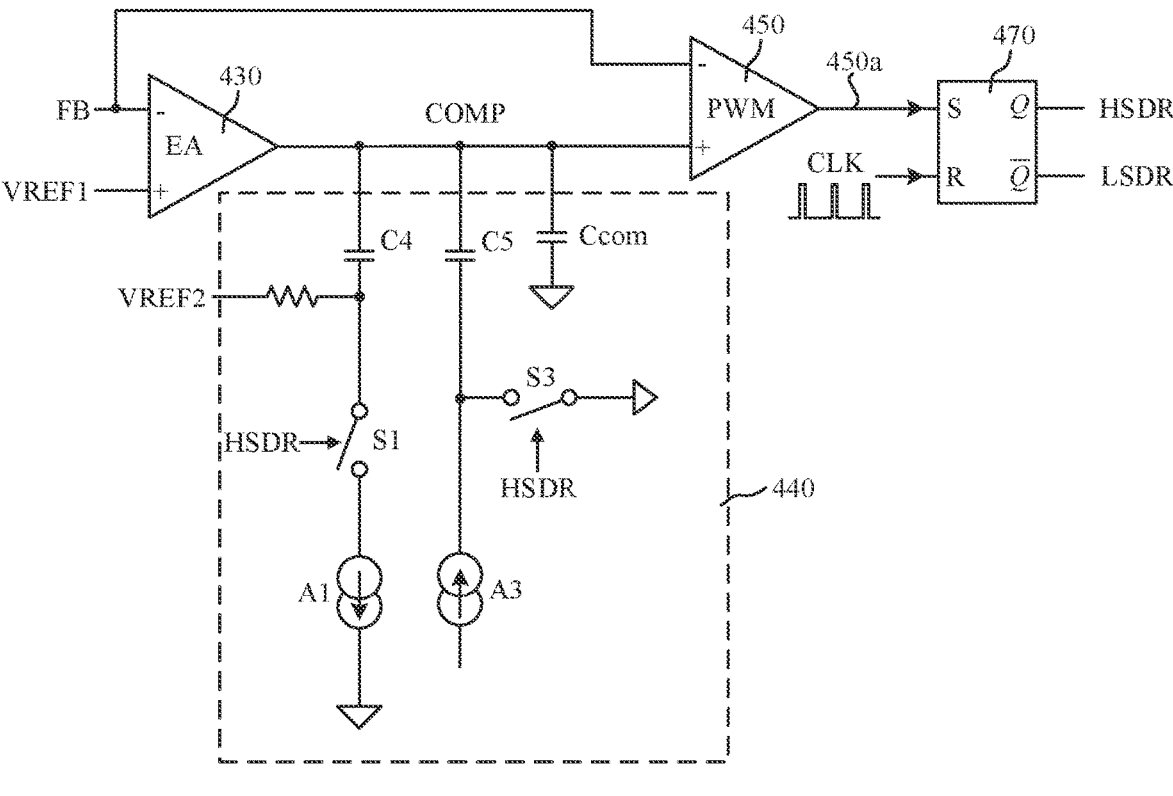
FIG. 5 shows a schematic diagram of a compensation circuit in a control circuit and a circuit module coupled thereto according to a second embodiment of the present disclosure.

The power converter according to this embodiment is shown in FIGS. 2 and 5.

Specifically, the power converter provided according to this embodiment has substantially the same structure as that of Embodiment 1 as described above, and thus details will be omitted.

The differences will be described here. In this embodiment, referring to FIG. 5, one of the differences is in the pulse generation circuit of the control circuit 400. Compared to the sawtooth wave signal generating branch in the compensation circuit 440 according to the above Embodiment 1, the sawtooth wave signal generating branch according to this embodiment is configured to: couple the compensation capacitor Ccom to a reference ground during a valid period of the switching control signal, and charge the compensation capacitor Ccom according to a first charging current (denoted as I3) during an invalid period of the switching control signal, thereby generating a sawtooth wave signal. Here, the first charging current I3 is controlled by an input voltage Vin of the power converter.

In the embodiment shown in FIG. 5, the sawtooth wave signal generating branch further comprises: a capacitor C5, a switch S3 and a current source A3. The current source A3 is coupled to an output of the error amplifier 430 through the capacitor C5, the switch S3 is coupled between an intermediate node of the capacitor C5 and the current source A3 and the reference ground, and the current source A3 is used to provide the charge current I3. The switch S3 is in an on state during a valid period of the switching control signal, and is in an off state during an invalid period of the switching control signal. In some examples, the switch S3 may be implemented, for example, as an NMOS transistor, and a control terminal of the switch S3 receives the high-side driver signal HSDR.

In this embodiment, assuming the first charging current I3=Vin*GM, it can be seen from FIG. 5 that when the high-side switch transistor Q1 is turned on in each switching cycle, that is, during a valid period of the high-side driver signal HSDR, a falling slope m4 of the compensation signal COMP is:

$$m4 = \frac{(VIN - VOUT) * G_M}{Ccom}, \tag{12}$$

When the high-side switching transistor Q1 is turned off, that is, during an invalid period of the high-side driver signal HSDR, a rising slope m5 of the compensation signal COMP is:

$$m5 = \frac{(VIN + VOUT) * G_M}{Ccom}, \tag{13}$$

Here, GM denotes transconductances of current source A1 and current source A3. It can be seen from the above equations (9), (12) and (13) that an example of the compensation circuit 440 shown in FIG. 5 can achieve a positively correlated relationship between a falling slope of the compensation signal COMP and the difference VIN-VOUT between an input voltage and an output voltage, and a positively correlated relationship between a rising slope of the compensation signal COMP and a sum VIN+VOUT of an input voltage and an output voltage. However, other examples are possible, and the compensation circuit 440 may be implemented as other different forms of circuitry, with the same positively correlated relationship as described above. For example, the first discharge current I1=Vin*GM and the first charging current I3=Vin*GM are described above as a preferred embodiment of the present disclosure. However, the first discharge current I1 and the first charging current I3 may be selected to have other suitable design values.

It can be understood that because of a positive correlation between the falling slope of the compensation signal COMP and the difference VIN-VOUT between the input voltage and the output voltage, and a positive correlation between the rising slope of the compensation signal COMP and the sum VIN+VOUT of the input voltage and the output voltage, an effect of feed-forward control of the system can also be achieved to a certain extent, but the feed-forward effect is weaker than that of the previous Embodiment 1. However, the compensation circuit 440 according to this embodiment can still generate a compensation signal COMP as a ripple signal, which facilitates subsequent comparing subsequent comparison between the compensation signal COMP and the feedback signal FB to obtain a switching control signal.

Further, compared with the comparator 450 according to the previous embodiment, a positive input terminal of the comparator 450 according to this embodiment receives the compensation signal COMP, a negative input terminal of the comparator 450 receives the feedback signal FB, and the comparator 450 outputs a comparison signal 450a to the controller 470 after comparing the feedback signal FB and the compensation signal COMP. The comparison signal 450a represents a magnitude relationship between the compensation signal COMP and the feedback signal FB, and further represents the moment when the compensation signal COMP rises to the feedback signal FB. During operation, the comparator 450 outputs a rising edge of the comparison signal 450a when the compensation signal COMP rises to be greater than the feedback signal FB, and outputs a falling edge of the comparison signal 450a when the compensation signal COMP falls to be less than the feedback signal FB.

On the other hand, compared with the controller 470 according to the aforementioned Embodiment 1, during operation, the controller 470 according to this embodiment switches the high-side driver signal HSDR from an invalid state to a valid state, and switches the low-side driver signal LSDR from a valid state to an invalid state, when receiving a rising edge of the comparison signal 450a; The controller 470 switches the high-side driver signal HSDR from a valid state an the invalid state, and switches the low-side driver signal LSDR from an invalid state to a valid state, when receiving a rising edge of the clock pulse signal CLK. The clock pulse signal CLK controls an off time of the high-side switch transistor Q1 by defining frequencies of the high-side driver signal HSDR and the low-side driver signal LSDR, here, the frequencies of the high-side driver signal HSDR and the low-side driver signal LSDR are equal to a frequency of the clock pulse signal CLK. The comparison signal 450a controls an on time of the high-side switch transistor Q1 by defining duty cycles of the high-side driver signal HSDR and the low-side driver signal LSDR. In the example shown in FIG. 5, the controller 470 may be implemented as, for example, an RS flip-flop, for achieving corresponding functions. Here, the controller 470 receives the comparison signal 450a at a set terminal T and the clock pulse signal CLK at a reset terminal R.

Figure 6:
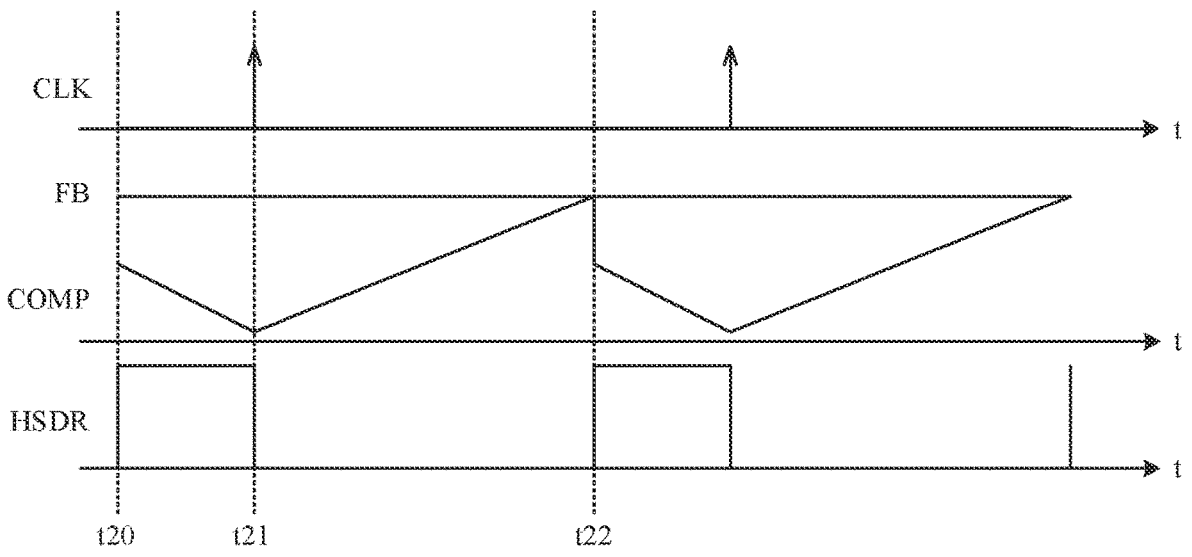
FIG. 6 shows a schematic waveform of the control circuit as shown in FIG. 2 during each switching cycle according to the second embodiment of the present disclosure.

Referring to FIG. 6, in this embodiment, at the beginning of each switching cycle, for example, at time t20, there is a rising edge of a comparison signal 450a when the compensation signal COMP is less than the feedback signal FB, which triggers the controller 470 to switch the high-side driver signal HSDR to a valid state such as a high level and to switch the low-side driver signal LSDR to an invalid state such as a low level. The switch S1 and the switch S3 are turned on. Thus, a different current between the current source A1 and a current through the resistance R1 by the reference signal VREF2 discharges the compensation capacitor Ccom through a capacitor C4, while the compensation capacitor Ccom is discharged through a capacitor C5 to a reference ground, so that the voltage of the compensation signal COMP drops. At time t21, there is a rising edge of the clock pulse signal CLK, which triggers the controller 470 to switch the high-side driver signal HSDR to an invalid state, and to switch the low-side driver signal LSDR to a valid state. The switch S1 and switch S3 are turned off. Thus, the compensation capacitor Ccom is charged by a reference signal VREF2 through a resistor R1 and a capacitor C4, while the compensation capacitor Ccom is also charged by a current source A3 through a capacitor C5, so that the voltage of the compensation signal COMP starts to rise. When the voltage of the compensation signal COMP rises to be greater than the feedback signal FB, there is a rising edge of the comparison signal 450a at time t22. Then, the controller 470 switches the high-side driver signal HSDR to an invalid state again, and switches the low-side driver signal LSDR to a valid state again, and the aforementioned process is repeated.

It can be understood that although there are differences in the connections of circuit units between Embodiment 1 and Embodiment 2, it is basically possible to achieve the same function.

Figure 7:
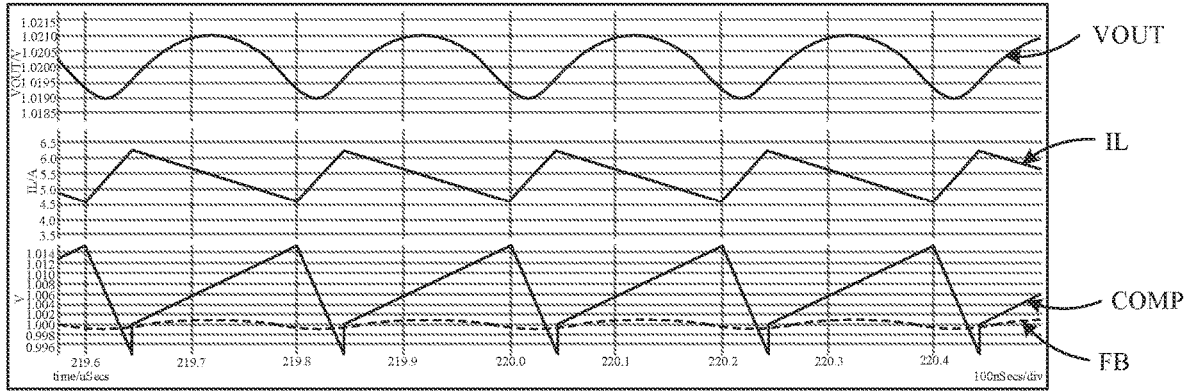
FIG. 7 shows schematic waveforms of the power converter as shown in FIG. 2 at a steady state.
Figure 8:
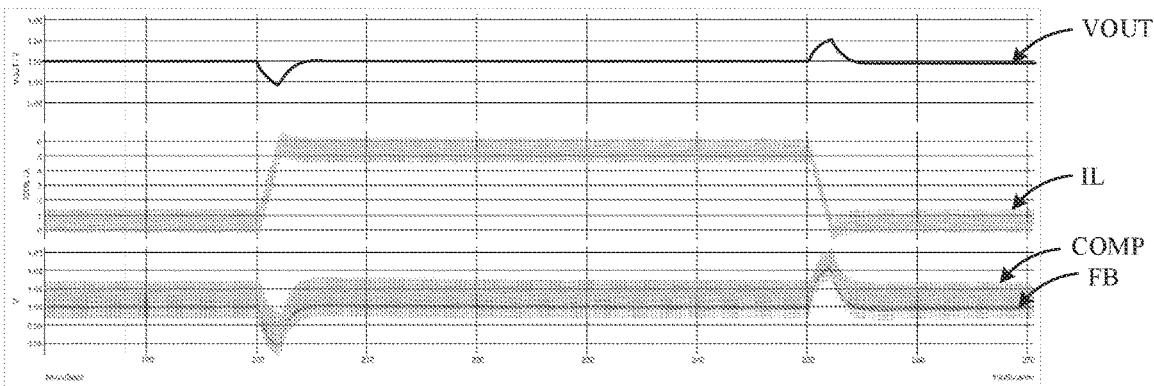
FIG. 8 shows schematic waveforms of the power converter as shown in FIG. 2 when a load fluctuates.

FIGS. 7 and 8 show schematic waveforms of the power converter during a steady state and load fluctuation, respectively. It can be seen from FIGS. 7 and 8 that the power converters according to various embodiments of the present disclosure have smooth waveforms of an inductor current and an output voltage during the steady state. During a dynamic adjustment period such as the load fluctuation, the output voltage has small fluctuation and recover at a fast speed. Therefore, the power converter system according to the embodiments of the present disclosure has good stability and fast dynamic response speed.

It can be understood that when the frequency of the clock pulse signal CLK is determined, the frequencies of the high-side driver signal HSDR and the low-side driver signal LSDR will be fixed. That is, the present disclosure can realize a constant frequency control of the power converter according to the clock pulse signal CLK, so that the power convener has a higher accuracy of the switching frequency when operating in a constant frequency control mode, which is beneficial for optimization of the electromagnetic interference and noise. Moreover, the constant frequency control is also easier to implement phase shift and parallel connection of multi-phase power converters. A closed-loop control of the power converter can be obtained without the needs for current detection and a high-bandwidth error amplifier, by generating a compensation signal COMP as a ripple signal after compensating an error amplification signal with a triangular wave signal that represents inductor current information, and by defining duty cycles of a high-side driver signal HSDR and a low-side driver signal LSDR according to comparison between the compensation signal COMP and a feedback signal FB. Thus, a fast response of the power converter can be achieved in the control process. Not only is it easy to realize the high-frequency application of the power converter, but also is the circuit complexity reduced.

Further, an embodiment of the present application further provides a control method of a power converter, which can be applied to the control circuit 400 as shown in FIGS. 2 to 5 above. Specifically, the control method includes: obtaining an error amplification signal according to a first reference signal and a feedback signal, the feedback signal being obtained according to an output voltage of the power converter; compensating the error amplification signal to obtain a compensation signal, the compensation signal being a ripple signal; comparing the feedback signal and the compensation signal to obtain a comparison signal; generating a switching control signal according a predetermined clock pulse signal having a first frequency and the comparison signal, the switching control signal being used to control a switching transistor in the power converter.

In this embodiment, the step of compensating an error amplification signal to obtain a compensation signal that is a ripple signal further comprises: superimposing a triangular wave signal on the error amplification signal to compensate for the error amplification signal. Here, the triangular wave signal represents inductor current information of the power converter.

In a further preferred embodiment, the step of compensating an error amplification signal to obtain a compensation signal that is a ripple signal further comprises: superimposing a sawtooth wave signal on the error amplification signal to compensate for the error amplification signal.

In some examples, a descending slope of the above-described triangular wave signal is positively correlated with difference between an input voltage and an output voltage of the power converter, a descending slope of the above-described sawtooth wave signal is positively correlated with an output voltage of the power converter, and a descending slope of the compensation signal after compensation is positively correlated with an input voltage of the power converter.

In this embodiment, a clock pulse signal is used to determine frequency of the switching control signal, and the comparison signal is used to determine a duty cycle of the switching control signal.

Specifically, in some examples, the step of—generating a switching control signal according a predetermined clock pulse signal having a first frequency and the comparison signal further comprises: switching the switching control signal from an invalid state to a valid state at a rising edge of the clock pulse signal; switching the switching control signal from a valid state to an invalid state at a rising edge of the comparison signal. Here, a rising edge of the comparison signal occurs when the compensation signal drops to less than the feedback signal.

In other examples, the step of generating a switching control signal according a predetermined clock pulse signal having a first frequency and the comparison signal further comprises: switching the switching control signal from an invalid state to a valid state at a rising edge of the comparison signal; switching the switching control signal from a valid state to an invalid state at a rising edge of the clock pulse signal, wherein a rising edge of the comparison signal occurs when the compensation signal rises to be greater than the feedback signal.

The implementation of various steps of the control method of the power converter described above can be referred to the embodiments of the power converter described above, and detailed description is omitted here.

To sum up, the control circuit according to an embodiment of the present disclosure generates a switching control signal with a frequency which is defined by a clock pulse signal with a first frequency. A constant frequency control of the power converter can be achieved, thereby enabling the power converter to have a higher accuracy of the switching frequency, which is beneficial for achieving optimization of electromagnetic interference and noise. A compensation signal is generated as a ripple signal after an error amplification signal is compensated. A duty cycle of the switching control signal is defined by comparing the compensation signal and the feedback signal, thereby enabling a fast response of the power converter without current detection and a high-bandwidth error amplifier, which not only facilitates a high-frequency application of the power converter, but also results in reduced circuit complexity.

Finally, it should be noted that: It is obvious that the above-described embodiments are merely illustrative of the present disclosure and are not intended to be limitation of the embodiments. For those of ordinary skill in the art, other variations or changes in different forms may be made on the basis of the above description. There is no need and no way to exhaust all the embodiments here. The obvious changes or variations derived therefrom are still within the scope of protection of the present disclosure.

What is claimed is:

1. A control circuit of a power converter for generating a switching control signal to control a switching transistor in the power converter, wherein the control circuit comprises:

an error amplifier that receives a first reference signal and a feedback signal and outputs an error amplification signal, the feedback signal being obtained according to an output signal of the power converter;

a compensation circuit that compensates the error amplification signal to obtain a compensation signal, the compensation signal being a ripple signal;

a comparator that compares the feedback signal and the compensation signal to obtain a comparison signal;

a controller that generates the switching control signal according to a predetermined clock pulse signal having a first frequency and the comparison signal, the clock pulse signal being used to determine a frequency of the switching control signal, and the comparison signal being used to determine a duty cycle of the switching control signal, wherein the compensation circuit is configured to:

generate a triangular wave signal according to a second reference signal and the switching control signal, the triangular wave signal representing inductor current information of the power converter, superimpose the triangular wave signal onto the error amplification signal in the compensation circuit to achieve compensation for the error amplification signal.

2. The control circuit according to claim 1, wherein the controller is configured to:

switch the switching control signal from an invalid state to a valid state according to a rising edge of the clock pulse signal; and switch the switching control signal from a valid state to an invalid state according to a rising edge of the comparison signal, wherein a rising edge of the comparison signal occurs when the compensation signal drops to less than the feedback signal.

3. The control circuit according to claim 1, wherein the controller is configured to:

switch the switching control signal from an invalid state to a valid state according to a rising edge of the comparison signal; and switch the switching control signal from a valid state to an invalid state according to a rising edge of the clock pulse signal, wherein a rising edge of the comparison signal occurs when the compensation signal rises to be greater than the feedback signal.

4. The control circuit according to claim 2, wherein a falling slope of the compensation signal is positively correlated with an input voltage of the power converter.

5. The control circuit according to claim 3, wherein a falling slope of the compensation signal is positively correlated with difference between an input voltage and an output voltage of the power converter, and a rising slope of the compensation signal is positively correlated with a sum of the input voltage and the output voltage of the power converter.

6. The control circuit according to claim 1, wherein the compensation circuit comprises:

a triangular wave signal generating branch coupled between an output of the error amplifier and a reference ground, the triangular wave signal generating branch is configured to discharge a compensation capacitor according to a first discharge current and the second reference signal during a valid period of the switching control signal, and to charge the compensation capacitor with a second reference signal during an invalid period of the switching control signal, thereby generating the triangular wave signal.

7. The control circuit according to claim 6, wherein the first discharge current is controlled by an input voltage of the power converter.

8. The control circuit according to claim 6, wherein the triangular wave signal generating branch comprises:

a first capacitor, a first switch and a current source sequentially coupled in series between an output of the error amplifier and a reference ground, the first current source being used to provide the first discharge current;

a first resistor coupled between an intermediate node of the first capacitor and the first switch and a receiving terminal of the second reference signal, wherein the first switch is in an on state during a valid period of the switching control signal and is in an off state during an invalid period of the switching control signal.

9. The control circuit according to claim 1, wherein the compensation circuit further generates a sawtooth wave signal according to the second reference signal and the switch control signal;

the compensation circuit further superimposes the sawtooth wave signal onto the error amplification signal to achieve compensation for the error amplification signal.

10. The control circuit according to claim 9, wherein the compensation circuit further comprises:

a first sawtooth wave signal generating branch coupled between an output of the error amplifier and a reference ground;

wherein the first sawtooth wave signal generation branch is configured to discharge a compensation capacitor according to a second discharge current during a valid period of the switching control signal, and to couple the compensation capacitor to the second reference signal during an invalid period of the switching control signal, thereby generating the sawtooth wave signal.

11. The control circuit of claim 10, wherein the second discharge current is controlled by an output voltage of the power converter.

12. The control circuit according to claim 10, wherein the first sawtooth wave signal generation branch comprises:

a second capacitor and a second current source sequentially coupled in series between an output of the error amplifier and a reference ground, the second current source being used to provide the second discharge current;

a second switch coupled between an intermediate node of the second capacitor and the second current source and a receiving terminal of the second reference signal, wherein the second switch is in an off state during a valid period of the switching control signal and is in an on state during an invalid period of the switching control signal.

13. The control circuit according to claim 9, wherein the compensation circuit further comprises:

a second sawtooth wave signal generating branch coupled between an output of the error amplifier and a reference ground, wherein the second sawtooth wave signal generation branch is configured to generate the sawtooth wave signal by coupling the compensation capacitor to a reference ground during a valid period of the switching control signal, and to charge the compensation capacitor with a first charging current during an invalid period of the switching control signal;

the first charging current is controlled by an input voltage of the power converter.

14. The control circuit according to claim 13, wherein the second sawtooth wave signal generation branch comprises:

a third current source coupled to an output of the error amplifier through a second capacitor, the third current source being used for providing the first charging current;

a third switch coupled between an intermediate node of the second capacitor and the third current source, and a reference ground;

wherein the third switch is in an on state during a valid period of the switching control signal and is in an off state during an invalid period of the switching control signal.

15. A power converter, comprising:

at least one power stage circuit, each of the power stage circuits comprising an inductor and a switching transistor coupled to the inductor;

a control circuit for providing a switching control signal to the at least one power stage circuit to control the switching transistor in each power stage circuit, wherein the control circuit comprises:

an error amplifier that receives a first reference signal and a feedback signal and outputs an error amplification signal, the feedback signal being obtained according to an output signal of the power converter;

a compensation circuit that compensates the error amplification signal to obtain a compensation signal, the compensation signal being a ripple signal;

a comparator that compares the feedback signal and the compensation signal to obtain a comparison signal;

a controller that generates the switching control signal according to a predetermined clock pulse signal having a first frequency and the comparison signal, the clock pulse signal being used to determine a frequency of the switching control signal, and the comparison signal being used to determine a duty cycle of the switching control signal, wherein the compensation circuit is configured to:

generate a triangular wave signal according to a second reference signal and the switching control signal, the triangular wave signal representing inductor current information of the power converter, superimpose the triangular wave signal onto the error amplification signal in the compensation circuit to achieve compensation for the error amplification signal.

* * * * *